(12) United States Patent
Derstine et al.

(10) Patent No.: US 11,262,664 B2
(45) Date of Patent: Mar. 1, 2022

(54) SYSTEM AND METHOD FOR PROTECTING OPTICS FROM VACUUM ULTRAVIOLET LIGHT

(71) Applicant: KLA Corporation, Milpitas, CA (US)

(72) Inventors: Matthew Derstine, Los Gatos, CA (US); John Savee, San Francisco, CA (US); Evgeniia Butaeva, San Jose, CA (US); Serguei Likhanski, San Jose, CA (US); Gildardo Delgado, Livermore, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/099,632

(22) Filed: Nov. 16, 2020

(65) Prior Publication Data

US 2021/0149315 A1    May 20, 2021

Related U.S. Application Data

(60) Provisional application No. 62/937,731, filed on Nov. 19, 2019.

(51) Int. Cl.
*C01B 7/01* (2006.01)
*G03F 7/20* (2006.01)

(52) U.S. Cl.
CPC ...... *G03F 7/70933* (2013.01); *G03F 7/70241* (2013.01); *G03F 7/70925* (2013.01)

(58) Field of Classification Search
CPC ............ G03F 7/70933; G03F 7/70241; G03F 7/70925; G03F 7/70983; G03F 7/70908; G02B 27/0006; G02B 1/14; G02B 5/0891; H01J 37/32357; H01L 21/67288; G21K 1/06; C23F 1/02
See application file for complete search history.

(56) References Cited

U.S. PATENT DOCUMENTS

| | | |
|---|---|---|
| 2004/0118834 A1 | 6/2004 | Ohmi et al. |
| 2005/0044802 A1 | 3/2005 | Bellman et al. |
| 2006/0289778 A1 | 12/2006 | Vincent et al. |
| 2008/0066778 A1 | 3/2008 | Matsushita et al. |
| 2012/0228261 A1 | 9/2012 | Watanabe et al. |

FOREIGN PATENT DOCUMENTS

WO      0101531 A1    1/2001

OTHER PUBLICATIONS

PCT International Search Report for International Application No. PCT/US2020/060928 dated Mar. 12, 2021, 7 pages.

*Primary Examiner* — Mesfin T Asfaw
(74) *Attorney, Agent, or Firm* — Suiter Swantz pc llo

(57) ABSTRACT

A system for mitigating damage to optical elements caused by vacuum ultraviolet (VUV) light exposure is disclosed. The system includes a light source configured to generate VUV and a chamber containing one or more gaseous fluorine-based compounds of a selected partial pressure. The system includes one or more optical elements. The one or more optical elements are located within the chamber and are exposed to the one or more gaseous fluorine-based compounds. The VUV light generated by the light source is of sufficient energy to dissociate the fluorine-based compound within the chamber into a primary product.

21 Claims, 7 Drawing Sheets

SYSTEM AND METHOD FOR PROTECTING OPTICS FROM VACUUM ULTRAVIOLET LIGHT

CROSS-REFERENCE TO RELATED APPLICATION

The present application claims the benefit under 35 U.S.C. § 119(e) of U.S. Provisional Application Ser. No. 62/937,731, filed Nov. 19, 2019, which is incorporated herein by reference in the entirety.

TECHNICAL FIELD

The present invention generally relates to mitigation of damage caused to optical elements, and, more particularly, to a system and method for providing a gaseous environment suitable for reducing damage caused to optical elements by vacuum ultraviolet light.

BACKGROUND

Damage to metal fluoride coatings from vacuum ultraviolet (VUV) exposure is poorly understood and most optical systems that incorporate these coatings typically utilize very low VUV intensities. One approach to mitigating this damage, in the case of $CaF_2$ materials, involves managing the oxidation of $CaF_2$ by removing water and oxygen via reactions with atomic fluorine. A related approach involves the cleaning of organic contaminants in deep ultraviolet (DUV) systems by injecting a small amount of oxygen into the purge gas and creating oxygen species using the existing DUV light, which oxidizes organic molecules. In the prior approaches, fluorine is utilized as an active element to remove water and oxygen only. These prior methods do not address the degradation of metal fluorides caused by fluorine depletion in general optical systems. Therefore, it would be desirable to provide a system and method that cure the shortfalls of the previous approaches identified above.

SUMMARY

A system for protecting metal fluoride optics from degradation caused by VUV light exposure is disclosed in accordance within one or more embodiments of the present disclosure. In one illustrative embodiment, the system includes a light source configured to generate vacuum ultraviolet (VUV) light. In another illustrative embodiment, the system includes a chamber containing one or more gaseous fluorine-based compounds of a selected partial pressure. In another illustrative embodiment, the system includes one or more optical elements, wherein at least a portion of the one or more optical elements are located within the chamber and are exposed to the one or more gaseous fluorine-based compounds. In another illustrative embodiment, the VUV light generated by the light source is of sufficient energy to dissociate the fluorine-based compound within the chamber into a primary product. In another illustrative embodiment, the chamber comprises one or more optical enclosures surrounding the one or more optical elements and configured to receive a purge-precursor mixture from a gas mixer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

One mechanism of damage in metal fluoride materials and coatings is the loss of fluorine after exposure to energetic radiation. This loss is the end result of a series of processes that start with absorption of radiation by the material and end with fluorine leaving the material. An additional mechanism of damage may include the diffusion of fluorine from the surface into the bulk of a given optical element. The loss of fluorine makes the materials susceptible to composition changes that significantly degrade the optical properties of an optical element made with these coatings or materials.

It is noted herein that if the environment surrounding the exposed area of the sample is rich enough in fluorine then the rate of fluorine leaving the material from the VUV damage mechanism can be balanced by the rate of fluorine adsorption into the material so that there is no net fluorine loss. For this process to most efficiently use the fluorine in the environment, the fluorine should be in atomic form rather than as molecular fluorine, fluorine ions, or other fluorinated compounds. In embodiments of this disclosure, atomic fluorine is created by cracking simple molecules such as, but not limited to, $F_2$ or HF and/or more complex compounds, such as, but not limited to, $NF_3$, $CF_4$, or $SF_6$. Embodiments of this disclosure are directed to a system and method for mitigating fluorine deficiency in optical materials by cracking fluorine-based precursor molecules (e.g., cracking with VUV light) near the given optical materials, which assists in balancing fluorine deficiency in the optical materials.

Figure 1A:
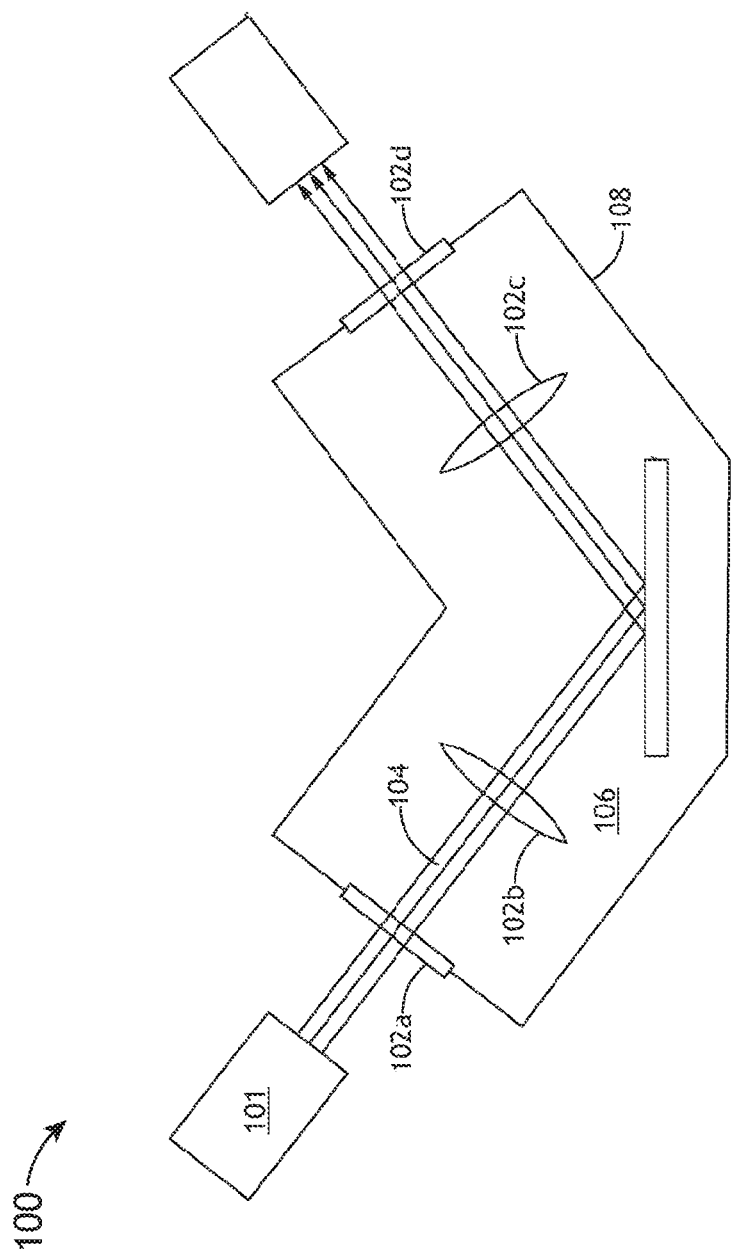
FIG. 1A illustrates a system for protecting optics from damage caused by VUV light, in accordance with one or more embodiments of the present disclosure.

FIG. 1A illustrates a system 100 for protecting optics from damage caused by VUV light, in accordance with one or more embodiments of the present disclosure.

In embodiments, the system 100 includes a light source 101 configured to generate vacuum ultraviolet (VUV) light 104 (e.g., 115-200 nm). The system 100 may include a chamber 108 containing one or more gaseous fluorine-based compounds 106 of a selected partial pressure. The system 100 may include one or more optical elements 102a-102d. At least a portion of the one or more optical elements 102a-102d are located within the chamber and are exposed to the one or more gaseous fluorine-based compounds 106. In embodiments, the VUV light 104 generated by the light source 101 is of sufficient energy to dissociate the fluorine-based compound(s) 106 within the chamber into at least a primary product.

The one or more optical elements 102a-102c may include any type of optical elements known in the art of VUV optics. For example, the one or more optical elements 102a-102c may include, but are not limited to, a lens, a mirror, a window, or a coating disposed on a lens, a mirror, or a window. The one or more optical elements 102a-102c may be fabricated from any material known in the art of VUV optics. For example, the one or more optical elements 102a-102c may be formed from a metal fluoride material. For instance, the one or more optical elements 102a-102c may be formed from one or more of $CaF_2$, $MgF_2$, $LaF_3$, or $AlF_3$.

The gaseous fluorine-based compound(s) 106 contained within the chamber 108 may include any compound that when 'cracked,' or dissociated, leads to a primary product, secondary product, or a tertiary product (and so on) that includes atomic fluorine. For example, the gaseous fluorine-based compound(s) may include one or more of $F_2$, $CF_4$, $SF_6$ and $NF_3$, $XeF_2$, HF, $CH_3CH_2F$, $CH_3F$, $CH_2F_2$, or $CH_3CF_3$. In embodiments, the one or more gaseous fluorine-based compounds 106 are maintained at a partial pressure between $10^{-7}$ to $10^{-2}$ Torr. For example, the one or more gaseous fluorine-based compounds 106 may be maintained at a partial pressure of $10^{-4}$ Torr.

The light source 101 may be configured to generate VUV light 104 of an intensity between 1 and 100 W/cm$^2$. For example, the light source 101 may be configured to generate VUV light 104 having an intensity of 25 W/cm$^2$, which provides a sufficient photon flux to crack fluorine-based molecules such as, but not limited to, $NF_3$ at the desired rate.

It is noted that different fluorine-based molecules may require different partial pressures and may require different VUV light intensity to lead to a sufficient cracking rate. As such, the intensities and partial pressures listed herein should not be interpreted as a limitation on the scope of the present disclosure, but are provided merely as examples.

Figure 1B:
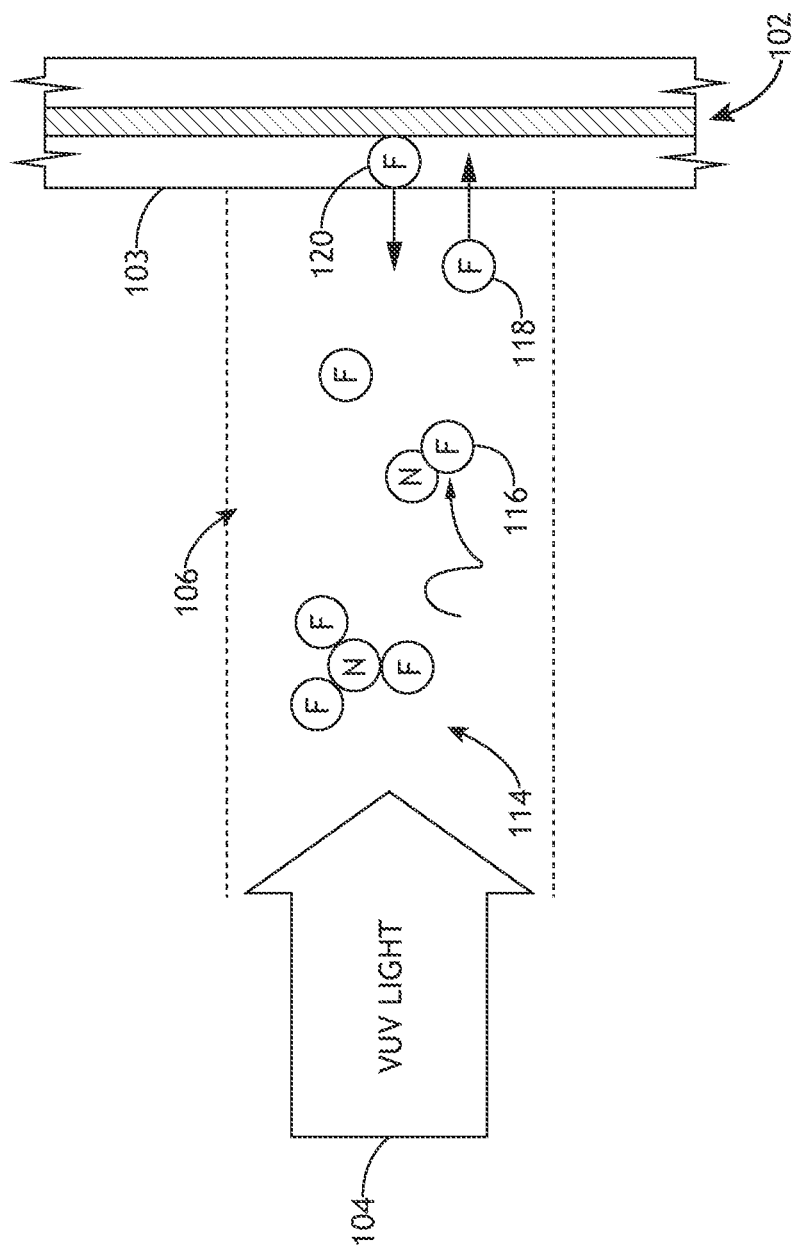
FIG. 1B illustrates an enlarged view of an optical element being protected from VUV light via a fluorine-enriched gas of system, in accordance with one or more embodiments of the present disclosure.

FIG. 1B illustrates an enlarged view of an optical element 102 being protected from VUV light 104 via fluorine-enriched gas 106 of system 100, in accordance with one or more embodiments of the present disclosure. In this embodiment, $NF_3$ is shown as a precursor gas 114. It is noted that the scope of the present disclosure is not limited to $NF_3$ as a precursor gas 114 and any number of fluorine-containing compounds, discussed herein, may be implemented within system 100. By way of example, $NF_3$ gas 114 is present around the surface 103 of the optical element 102. The $NF_3$ molecules are dissociated by the VUV light 104 and form atomic F as well as intermediate compounds. With sufficient intensity of VUV light (e.g., >1 W/cm$^2$) and a high enough $NF_3$ partial pressure (e.g., $10^{-4}$ Torr) fluorine loss from the material of the surface 103 can be significantly reduced. For instance, the intensity of the VUV light may be selected between 15-35 W/cm$^2$.

There are several ways to achieve the required partial pressure of atomic fluorine. In FIG. 1B, the fluorine is generated by cracking stable $NF_3$ molecules. This approach has the advantage that the precursor molecule exists as a stable gas and can be introduced into the optical system with large partial pressures. In the embodiment in FIG. 1B, cracking is accomplished by using VUV light to excite the molecules, which leads to their dissociation. It is noted that in some cases the primary dissociation products 116 would also be subject to further photodissociation into secondary products 118. Thus, with sufficient precursor partial pressure and appropriate intensity of VUV light, a sufficient high atomic fluorine density can be achieved to dramatically reduce fluorine loss in the coating or material.

Figure 1C:
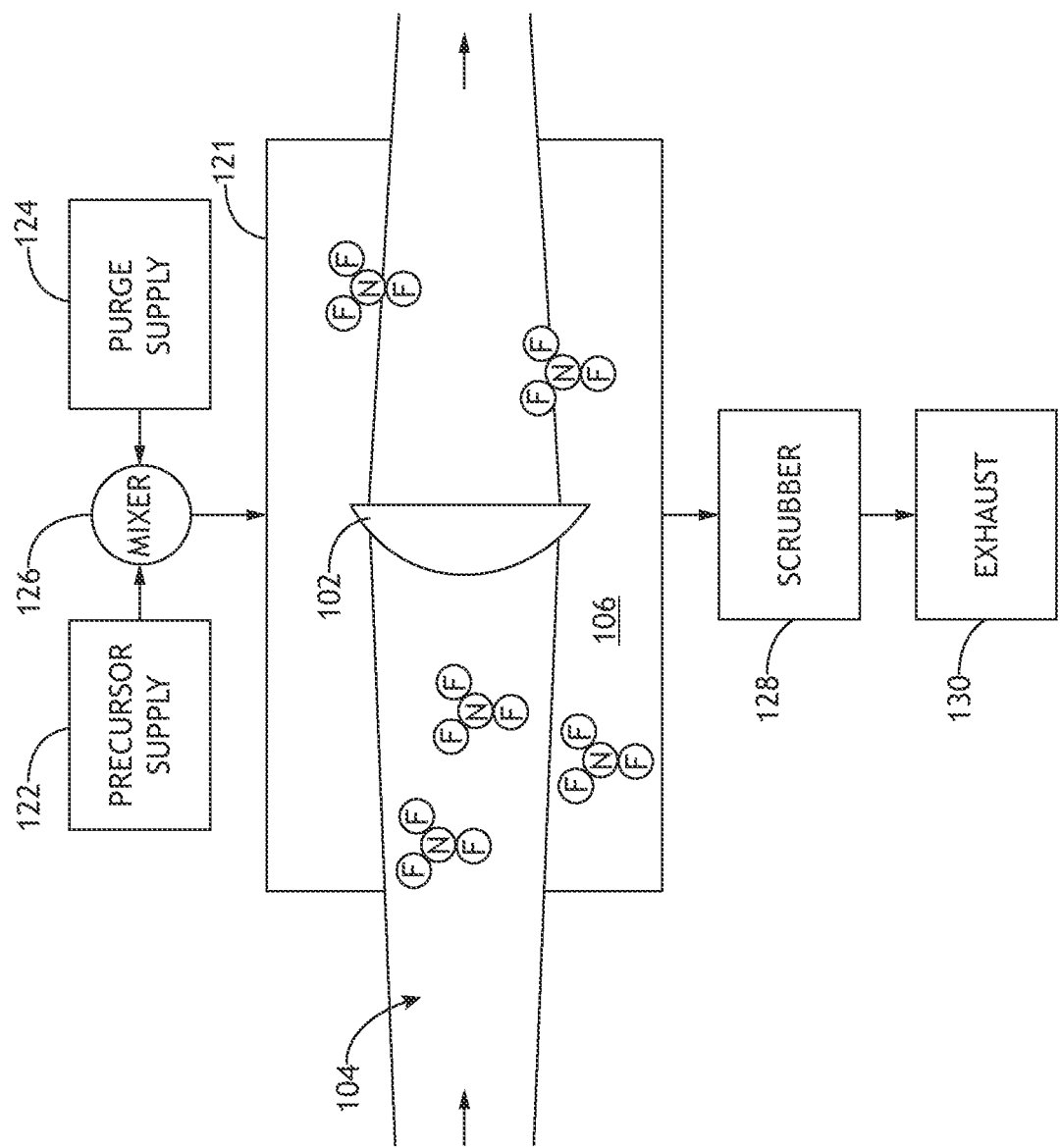
FIG. 1C illustrates the system for protecting optics from damage caused by VUV light including a precursor gas supply, a purge gas supply, and a scrubber, in accordance with one or more embodiments of the present disclosure.

FIG. 1C illustrates the system 100 for protecting optics from damage caused by VUV light including, in accordance with one or more embodiments of the present disclosure. In this embodiment, the system 100 further includes a precursor gas supply 122, a purge gas supply 124, and a mixer 126. In addition, the system 100 may include a scrubber 128 and exhaust 130.

In this embodiment, the system 100 includes one or more individual optics enclosures 121. The one or more optics enclosures 121 may be constructed such that the system 100 contains or flows purified purge gas from the purge gas supply 124 with extremely low concentration of oxidizing molecules and a small amount of a fluorinated compound on or near the optical elements 102. For example, the optics enclosure 121 may receive purified purge gas (e.g., Ar) from the purge gas supply 124 mixed, via mixer 126, with a small amount of a fluorine-rich gas from the precursor supply 122. This approach enables the amount of atomic fluorine to be adjusted in different parts of the system to match the protection needed at VUV levels available and still use the same fluorine precursor concentration. It is noted that the one or more optics enclosures 121 may be housed within chamber 108. In this regard, each optical element within the chamber 108 may be equipped with an optics enclosure 121 so that the photoproducts generated by the VUV light are sequestered in the volume proximate to (near) a given optical element, such as shown in FIG. 1C. The ends of the optical enclosure 121 may be opened to gas flow.

In embodiments, the chamber 108 may include (or be comprised of) multiple optics enclosures 121, whereby each optics enclosure 121 surrounds one or more optical elements 102. In one embodiment, the mixer 126 may be fluidically coupled to the chamber 108 (e.g., via one or more gas lines) and configured to flow the mixed gas through the entire chamber, whereby the mixed gas flows into the optics enclosures 121 within the chamber 108. Alternatively and/or additionally, the system 100 may include one or more optics enclosures 121 (e.g., a single optics enclosure or multiple optics enclosures), with each enclosure being fluidically coupled to the mixer 126. In this case, mixed gas may flow from the mixer 126 may flow into the optics enclosures 121. Alternatively and/or additionally, the system 100 may include multiple optics enclosures 121, whereby each enclosure is independently fluidically coupled to a dedicated mixer 126. Alternatively and/or additionally, the chamber 108 need not include any dedicated optics enclosures. In this case, the chamber 108 itself may act as an optics enclosure for multiple optical elements, whereby mixed gas may flow from the mixer 126 into the volume of the chamber 108, thus surrounding all of the optical elements 102 within the chamber 108.

It is noted that the purified purge gas (e.g., Ar) may be decontaminated to the level of tens of parts-per-million (ppm) for $H_2O$, $O_2$, CO, $CO_2$. It is noted that this level of decontamination does not limit the scope of the present disclosure as it is contemplated that embodiments of the present disclosure may utilize a decontamination level of purified purge gas on the order of parts-per-billion (ppb).

As shown in FIG. 1C, the purge gas mixture, and any contaminants that it has picked up, are exhausted from the system 100 via scrubber 128 and exhaust 130 that either removes fluorinated compounds or inhibits their reactivity. It is noted that some of the photoproducts have the potential to react with the optics, the enclosure material, and other contaminants. These processes may be addressed during design and material choice used in the implementation. For instance, the implementation of the scrubber 128 and exhaust 130 assists in reducing oxidation that would otherwise be caused by the HF created from the reaction of fluorine atoms with residual water in the system 100. The removal of water from the system 100 reduces HF production and, thus, the amount of oxidation from contamination in the system 100.

Figure 2:
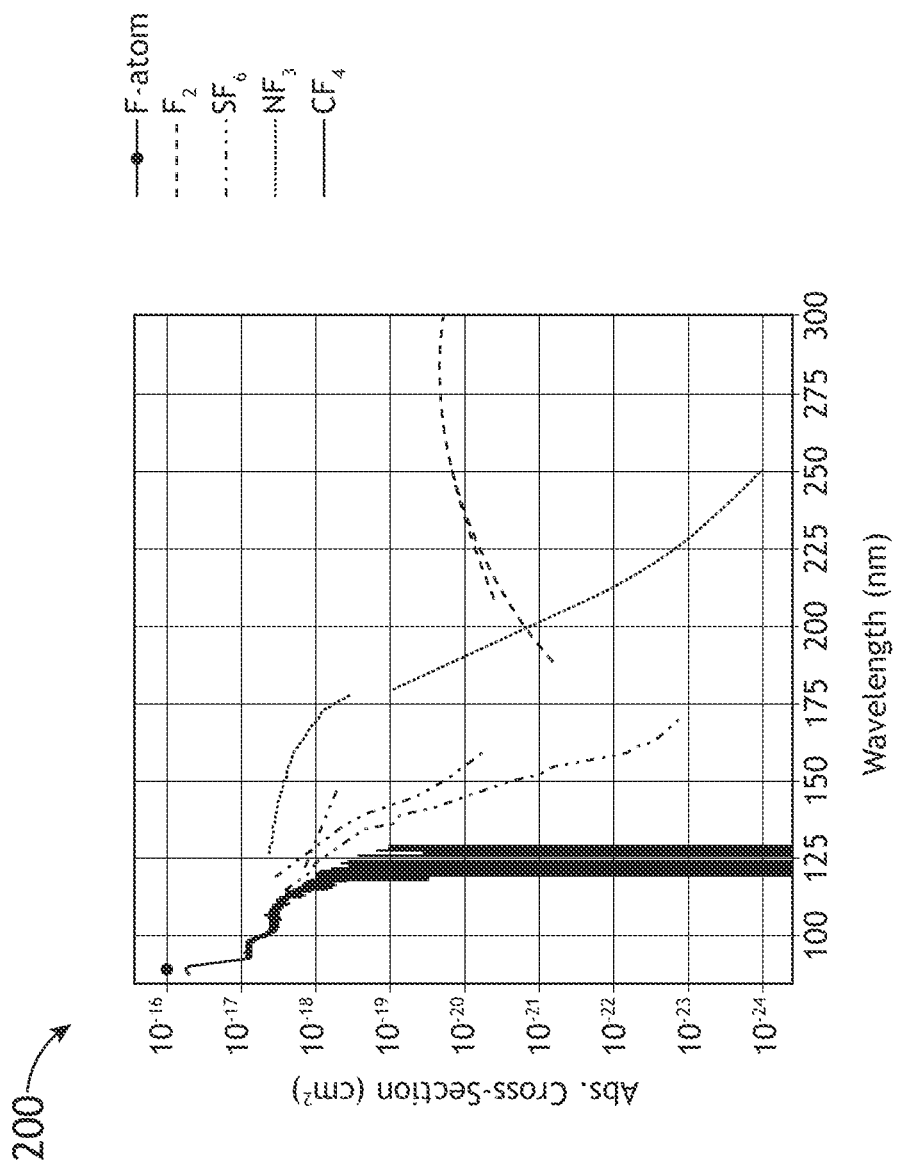
FIG. 2 illustrates a graph depicting the absorption spectra for several precursors, in accordance with one or more embodiments of the present disclosure.

FIG. 2 illustrates a graph 200 depicting the absorption spectra for several possible precursors, in accordance with one or more embodiments of the present disclosure. It is observed that wavelengths shorter than 200 nm are better absorbed (i.e., higher absorption cross-section) for molecule such as $CF_4$, $NF_3$, and $SF_6$. At these short wavelengths, the energy of the absorbed photons is sufficiently high to dissociate atomic fluorine from the precursor molecules. As shown in FIG. 2, atomic fluorine absorbs at wavelengths shorter than 100-nm. Light at wavelengths longer than 100 nm will photodissociate the precursor molecules in question but not ionize them or atomic fluorine. The absorption spectra in FIG. 2 demonstrates that $CF_4$, $SF_6$ and $NF_3$ all have promising absorption in the VUV spectral range to be atomic fluorine precursors for embodiments of the present disclosure. It is also noted that these molecules are safer and less corrosive than $F_2$. As noted previously herein, many other fluorinated precursor molecules such as, but not limited to, $XeF_2$, HF, $C_xH_yF_z$ (e.g., $CH_3CH_3F$, $CH_3F$, $CH_2F_2$, $CH_3CF_3$) and larger $C_xF_y$ species can also be used in embodiments of the present disclosure.

The amount of atomic fluorine needed to replenish the depleted fluorine may depend on a number of factors. For example, the amount of atomic fluorine necessary to mitigate fluorine depletion in an optical element may depend on the coating density or the bulk material type of the optical element. By way of another example, the spectral intensity of the VUV light may impact the amount of atomic fluorine necessary to mitigate fluorine depletion in an optical element.

Figure 3:
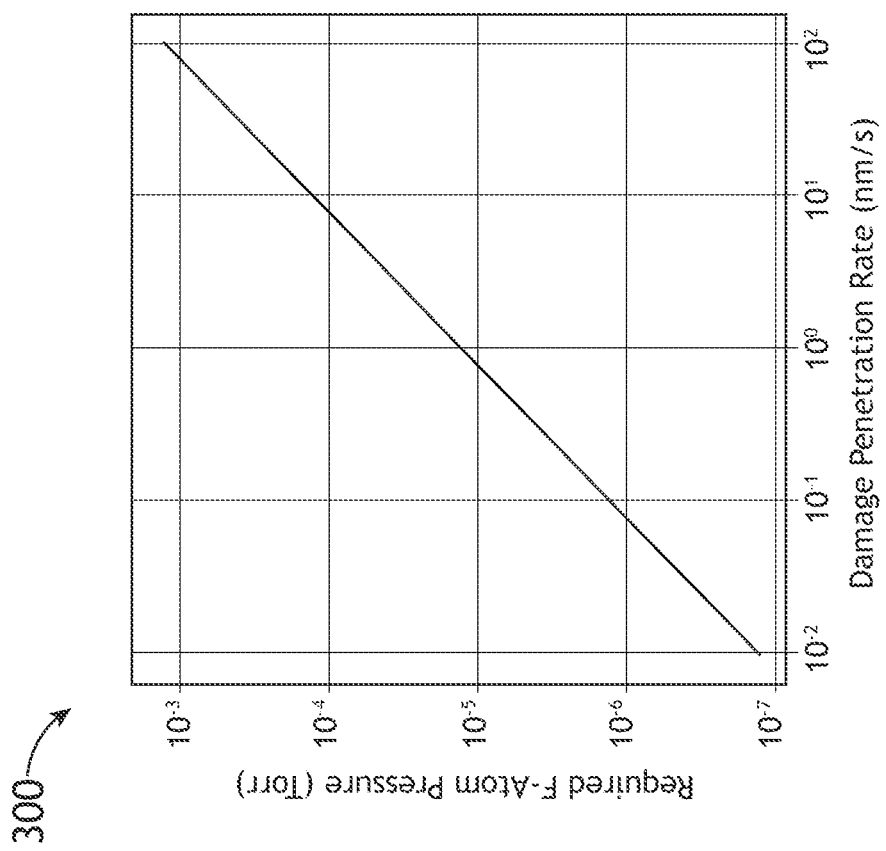
FIG. 3 illustrates a graph depicting an estimation of the atomic fluorine partial pressure needed to produce a collisional flux at a crystalline $MgF_2$ surface that is equal to the rate at which fluorine atoms leave due to VUV damage occurring at a given rate of penetration into the sample, in accordance with one or more embodiments of the present disclosure.

FIG. 3 illustrates a graph 300 depicting an example estimation of the atomic fluorine partial pressure needed to have a collisional flux at a crystalline $MgF_2$ surface that is equal to the rate at which fluorine atoms leave due to VUV damage occurring at a given rate of penetration into the sample. As noted, the rate at which fluorine atoms leave a metal fluoride will depend on many factors, which include the density of the optical material, and the spectral irradiance of the light impinging upon it. FIG. 3 demonstrates that very low (ppm-level) atomic fluorine partial pressures are required to achieve the condition where the flux of atomic fluorine leaving the optical material matches the incoming flux. FIG. 3 further illustrates an example of atomic fluorine partial pressures, which, for intense VUV light sources, are on the same order as the required partial pressures for the fluorinated precursor. However, with the absorption behavior shown in FIG. 2, if the partial pressure of the precursor is too high, the absorption of the precursor molecules will be sufficient to attenuate the VUV light and impair performance.

Figure 4:
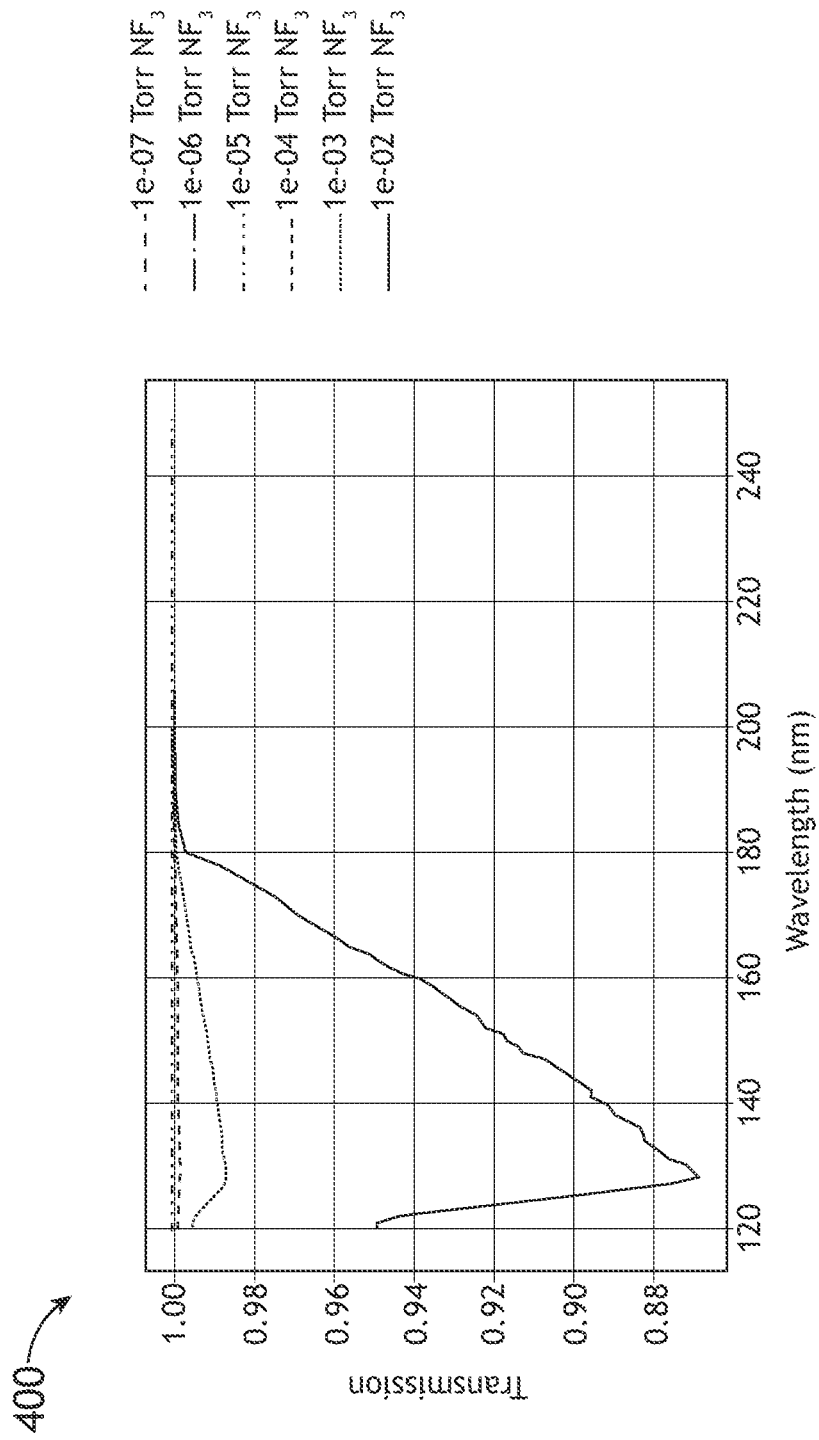
FIG. 4 illustrates a graph depicting the calculated transmission of VUV light through one meter of $NF_3$ gas at different partial pressures, in accordance with one or more embodiments of the present disclosure.

FIG. 4 illustrates a graph 400 depicting the calculated transmission of VUV light through one meter of $NF_3$ gas at different partial pressures, in accordance with one or more embodiments of the present disclosure. The curves in FIG. 4 are calculated using the Beer-Lambert relationship for the attenuation of VUV light in the presence of $NF_3$. Graph 400 shows that even at $NF_3$ partial pressures of $10^{-2}$ Torr, the attenuation may be easily managed.

As shown in FIGS. 1A-1B, protecting the optics of a VUV system 100 may be accomplished by using the same light crossing the system 100 (i.e., light used for inspection, metrology, lithography, and the like) to crack the precursor and raise the atomic fluorine concentration within the chamber 108. Alternatively and/or additional, an external VUV source or an electrical discharge device may be implemented to crack the molecules.

Figure 5:
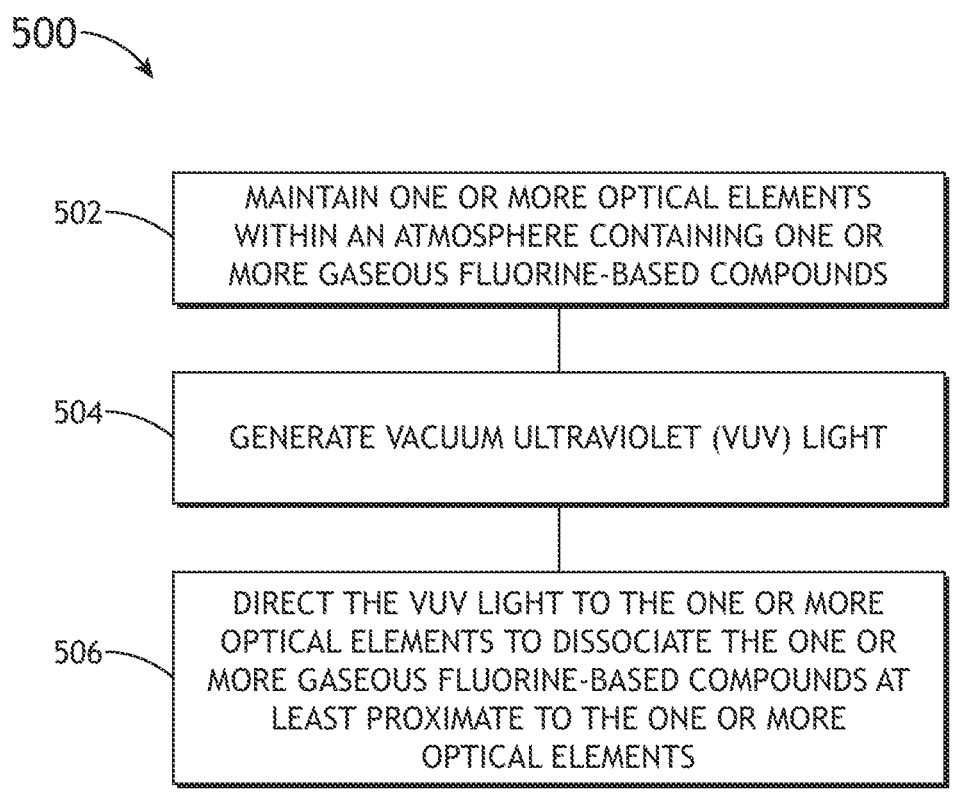
FIG. 5 illustrates a flow diagram depicting a method of protecting one or more optical elements from VUV light exposure, in accordance with one or more embodiments of the present disclosure.

FIG. 5 illustrates a flow diagram depicting a method 500 for protecting one or more optical elements from VUV light exposure, in accordance with one or more embodiments of the present disclosure. It is noted herein that the steps of method 500 may be implemented all or in part by system 100. It is further recognized, however, that the method 500 is not limited to the system 100 in that additional or alternative system-level embodiments may carry out all or part of the steps of method 500.

In step 502, one or more optical elements are maintained within an atmosphere containing one or more gaseous fluorine-based compounds. For example, as shown in FIG. 1A, the optical elements 102a-102d may be positioned within (or serve as windows to) the chamber 108. The chamber 108 may then be filled with an atmosphere that contains one or more gaseous fluorine-based compounds. For instance, the chamber 108 may be filled with an atmosphere containing a purge gas (e.g., argon) and a precursor gas (e.g., $NF_3$). In step 504, VUV light is generated. For example, as shown in FIG. 1A, the light source 101 (e.g., laser-sustained plasma (LSP) source or gas discharge source) may emit VUV light 104. In step 506, the VUV light is directed to the one or more optical elements to dissociate the one or more gaseous fluorine-based compounds in at least an area proximate to the one or more optical elements.

It is further contemplated that each of the embodiments of the method described above may include any other step(s) of any other method(s) described herein. In addition, each of the embodiments of the method described above may be performed by any of the systems described herein.

One skilled in the art will recognize that the herein described components, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
    a light source configured to generate vacuum ultraviolet (VUV) light;
    a chamber containing one or more gaseous fluorine-based compounds of a selected partial pressure; and
    one or more optical elements, wherein at least a portion of the one or more optical elements are located within the chamber and are exposed to the one or more gaseous fluorine-based compounds,
    wherein the VUV light generated by the light source is of sufficient energy to dissociate the fluorine-based compound within the chamber into a primary product.

2. The system of claim 1, further comprising:
    a precursor supply, a purge supply, and a gas mixer.

3. The system of claim 2, wherein the chamber comprises one or more optical enclosures surrounding the one or more optical elements and configured to receive a purge-precursor mixture from the gas mixer.

4. The system of claim 3, further comprising:
a scrubber.

5. The system of claim 1, wherein the primary product includes at least atomic fluorine.

6. The system of claim 1, wherein the VUV light generated by the light source is of sufficient energy to dissociate the primary product into a secondary product.

7. The system of claim 6, wherein at least one of the primary product or the secondary product includes at least atomic fluorine.

8. The system of claim 1, wherein the one or more optical elements comprise at least one of a lens, a mirror, or a window.

9. The system of claim 1, wherein the one or more optical elements comprise an optical coating disposed on at least one of a lens, a mirror, or a window.

10. The system of claim 1, wherein the one or more optical elements are comprised of a metal fluoride material.

11. The system of claim 10, wherein the one or more optical elements are comprised of at least one of $CaF_2$, $MgF_2$, $LaF_3$ or $AlF_3$.

12. The system of claim 1, wherein the one or more gaseous fluorine-based compounds comprise at least one of $CF_4$, $SF_6$, $NF_3$, $XeF_2$, HF, $CH_3CH_2F$, $CH_3F$, $CH_2F_2$, or $CH_3CF_3$.

13. The system of claim 1, wherein the one or more gaseous fluorine-based compounds are maintained at a partial pressure between $10^{-7}$ to $10^{-2}$ Torr.

14. The system of claim 1, wherein the light source comprises:
a broadband light source.

15. The system of claim 14, wherein the light source comprises:
one or more laser sustained plasma (LSP) sources or one or more gas discharge sources.

16. A method comprising:

maintaining a gaseous environment within a chamber containing one or more gaseous fluorine-based compounds at a selected partial pressure;

generating vacuum ultraviolet (VUV) light; and directing the VUV light to one or more optical elements within the chamber, wherein the VUV light generated by a light source is of sufficient energy to dissociate the fluorine-based compound within the chamber into a primary product to inhibit fluorine migration out of the one or more optical elements within the chamber.

17. The method of claim 16, wherein the one or more optical elements are comprised of a metal fluoride material.

18. The method of claim 16, wherein the one or more optical elements are comprised of at least one of $CaF_2$, $MgF_2$, $LaF_3$, or $AlF_3$.

19. The method of claim 16, wherein the one or more optical elements comprise at least one of a lens, a mirror, a window, or a coating disposed on at least one of a lens, a mirror, or a window.

20. The method of claim 19, wherein the primary product includes at least atomic fluorine.

21. The method of claim 20, wherein the one or more gaseous fluorine-based compounds comprise at least one of $CF_4$, $SF_6$, $NF_3$, $XeF_2$, HF, $CH_3CH_2F$, $CH_3F$, $CH_2F_2$, or $CH_3CF_3$.

* * * * *